(12) United States Patent
Pedersen et al.

(10) Patent No.: US 8,356,019 B1
(45) Date of Patent: Jan. 15, 2013

(54) METHOD AND APPARATUS FOR UTILIZING PATTERNS IN DATA TO REDUCE FILE SIZE

(75) Inventors: Bruce Pedersen, San Jose, CA (US); Jim Park, San Jose, CA (US); Peter Kazarian, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1426 days.

(21) Appl. No.: 10/316,371

(22) Filed: Dec. 11, 2002

(51) Int. Cl.
*G06F 7/00* (2006.01)
*G06F 17/00* (2006.01)

(52) U.S. Cl. ........................................ 707/693

(58) Field of Classification Search .............. 707/3, 101, 707/100, 103, 200, 693, 999.101; 717/128; 341/55
See application file for complete search history.

(56) References Cited

U.S. PATENT DOCUMENTS

| | | | | |
|---|---|---|---|---|
| 5,563,592 A | * | 10/1996 | Cliff et al. | 341/63 |
| 5,826,077 A | * | 10/1998 | Blakeley et al. | 707/4 |
| 5,835,601 A | * | 11/1998 | Shimbo et al. | 713/165 |
| 5,838,965 A | * | 11/1998 | Kavanagh et al. | 707/103 R |
| 5,860,074 A | * | 1/1999 | Rowe et al. | 715/526 |
| 5,900,870 A | * | 5/1999 | Malone et al. | 715/866 |
| 5,995,978 A | * | 11/1999 | Cullen et al. | 707/104.1 |
| 6,026,397 A | * | 2/2000 | Sheppard | 707/5 |
| 6,298,321 B1 | * | 10/2001 | Karlov et al. | 704/10 |
| 6,525,678 B1 | * | 2/2003 | Veenstra et al. | 341/55 |
| 6,535,886 B1 | * | 3/2003 | Koontz | 707/102 |
| 6,681,221 B1 | * | 1/2004 | Jacobs | 707/5 |
| 6,684,219 B1 | * | 1/2004 | Shaw et al. | 707/103 R |
| 6,700,513 B2 | * | 3/2004 | McGuire | 341/107 |
| 6,782,393 B1 | * | 8/2004 | Balabanovic et al. | 707/104.1 |
| 6,842,876 B2 | * | 1/2005 | Schilit et al. | 715/530 |
| 2002/0002555 A1 | * | 1/2002 | Wolman et al. | 707/101 |
| 2003/0005404 A1 | * | 1/2003 | Bowyer et al. | 716/18 |
| 2003/0103225 A1 | * | 6/2003 | Hyodo et al. | 358/1.13 |

* cited by examiner

*Primary Examiner* — Cam Truong
(74) *Attorney, Agent, or Firm* — L. Cho (57) ABSTRACT

A method for managing records in an object-oriented database is disclosed. Modified representations of data in fields of records is generated in response to patterns in the data. The modified representations of the data is compressed utilizing similarities in the modified representations of the data.

16 Claims, 8 Drawing Sheets

| FILE OFFSET | VALUE |
|---|---|
| 1 | 1 |
| 2 | 2 |
| 3 | 0 |
| 4 | 20 |
| 5 | 5 |
| 6 | 2 |
| 7 | 3 |
| 8 | 1 |
| 9 | 40 |
| 10 | 5 |
| 11 | 3 |
| 12 | 4 |
| 13 | 2 |
| 14 | 60 |
| 15 | 5 |
| 16 | 4 |
| 17 | 5 |
| 18 | 3 |
| 19 | 60 |
| 20 | 5 |

| FILE OFFSET | VALUE |
|---|---|
| 21 | 5 |
| 22 | 6 |
| 23 | 4 |
| 24 | 20 |
| 25 | 10 |
| 26 | 6 |
| 27 | 7 |
| 28 | 5 |
| 29 | 40 |
| 30 | 10 |
| 31 | 7 |
| 32 | 8 |
| 33 | 6 |
| 34 | 60 |
| 35 | 10 |
| 36 | 8 |
| 37 | 9 |
| 38 | 7 |
| 39 | 60 |
| 40 | 10 |

| FILE OFFSET | VALUE |
|---|---|
| 41 | 9 |
| 42 | 10 |
| 43 | 8 |
| 44 | 20 |
| 45 | 20 |
| 46 | 10 |
| 47 | 11 |
| 48 | 9 |
| 49 | 40 |
| 50 | 20 |
| 51 | 11 |
| 52 | 12 |
| 53 | 10 |
| 54 | 60 |
| 55 | 20 |
| 56 | 12 |
| 57 | 0 |
| 58 | 11 |
| 59 | 60 |
| 60 | 20 |

| FILE OFFSET | VALUE |
|---|---|
| 1 | +1 |
| 2 | +2 |
| 3 | 88888888 |
| 4 | +20 |
| 5 | +5 |
| 6 | +1 |
| 7 | +1 |
| 8 | +1 |
| 9 | +10 |
| 10 | +0 |
| 11 | +1 |
| 12 | +1 |
| 13 | +1 |
| 14 | +10 |
| 15 | +0 |
| 16 | +1 |
| 17 | +1 |
| 18 | +1 |
| 19 | +10 |
| 20 | +0 |

| FILE OFFSET | VALUE |
|---|---|
| 21 | +1 |
| 22 | +1 |
| 23 | +1 |
| 24 | -30 |
| 25 | +5 |
| 26 | +1 |
| 27 | +1 |
| 28 | +1 |
| 29 | +10 |
| 30 | +0 |
| 31 | +1 |
| 32 | +1 |
| 33 | +1 |
| 34 | +10 |
| 35 | +0 |
| 36 | +1 |
| 37 | +1 |
| 38 | +1 |
| 39 | +10 |
| 40 | +0 |

| FILE OFFSET | VALUE |
|---|---|
| 41 | +1 |
| 42 | +1 |
| 43 | +1 |
| 44 | -30 |
| 45 | +5 |
| 46 | +1 |
| 47 | +1 |
| 48 | +1 |
| 49 | +10 |
| 50 | +5 |
| 51 | +1 |
| 52 | +1 |
| 53 | +1 |
| 54 | +10 |
| 55 | +5 |
| 56 | +1 |
| 57 | 88888888 |
| 58 | +1 |
| 59 | +10 |
| 60 | +0 |

METHOD AND APPARATUS FOR UTILIZING
PATTERNS IN DATA TO REDUCE FILE SIZE

FIELD OF THE INVENTION

The present invention relates to object-oriented databases. More specifically, the present invention relates to a method and apparatus for compressing an object-oriented database that is stored on a persistent storage device.

BACKGROUND OF THE INVENTION

Data structures used by computer programs often include various record or object types. Each of these record types includes a fixed number of fixed-sized fields. Each field may include another record type or a built-in type such as an integer or pointer to another object. Often times, there may be multiple instances of each record type where each instance has a same number of fields but each including different data between the various instances. Computer programs are often called upon to write these data structures onto a persistent storage device.

One approach used in the past to write data structures onto a persistent storage device was to write the image of each record directly to disk either as binary image or encoded in a human-readable character set. This required that every byte of a record correspond to a byte on the disk or multiple characters on a disk. This resulted in very large data structures. In order to reduce the size of the data structure, dictionary-based algorithms were used to compress the data in the data structures. The dictionary-based algorithms compressed data by finding strings of bytes that are repeated in a file, and replacing subsequent instances of the same string with a shorter identifier that refers back to a previous instance of the string. These same algorithms were occasionally augmented with the ability to repeat multiple occurrences in a row of either a single character or a multi-character sting by using a repeat-count. The longer the repeated strings encountered, the larger the compression ratio would be.

The effectiveness of dictionary-based compression algorithms were hindered, however, by the short, non-repeated strings that naturally occurred in object-oriented databases. Thus, what is needed is an effective method for compressing data stored in object-oriented database as well as other data having short, non-repeating strings with patterns.

SUMMARY

According to an embodiment of the present invention, a method for compressing an object-oriented database is disclosed. The method includes pre-processing the database prior to utilizing a dictionary-based compression algorithm. The pre-processing increases the likelihood that long strings of repeating data will be handled by the dictionary-based algorithm. According to an aspect of this embodiment, modified representations of data in fields of records are generated in response to patterns in the data. The patterns in the data may include, for example, incrementation of values that are persistent throughout the database. The modified representations may include an arithmetic difference between the data in a field of a record and data in a corresponding field of a previous instance of the record. Modified representations of the data are compressed in response to the similarities in the modified representations of the data.

According to a second embodiment of the present invention, a method for transporting an object-oriented database that includes routing architecture data of a programmable logic device (PLD) is disclosed. Looping structures are used to describe routing architecture patterns in the PLD. The looping structures are transmitted to a destination. An object-oriented database is generated from the looping structures at the destination.

BRIEF DESCRIPTION OF THE DRAWINGS

The features and advantages of the present invention are illustrated by way of example and are not intended to limit the scope of the present invention to the particular embodiments shown, and in which.

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well-known circuits, devices, and software modules are shown in block diagram form to avoid obscuring the present invention unnecessarily.

Figure 1:
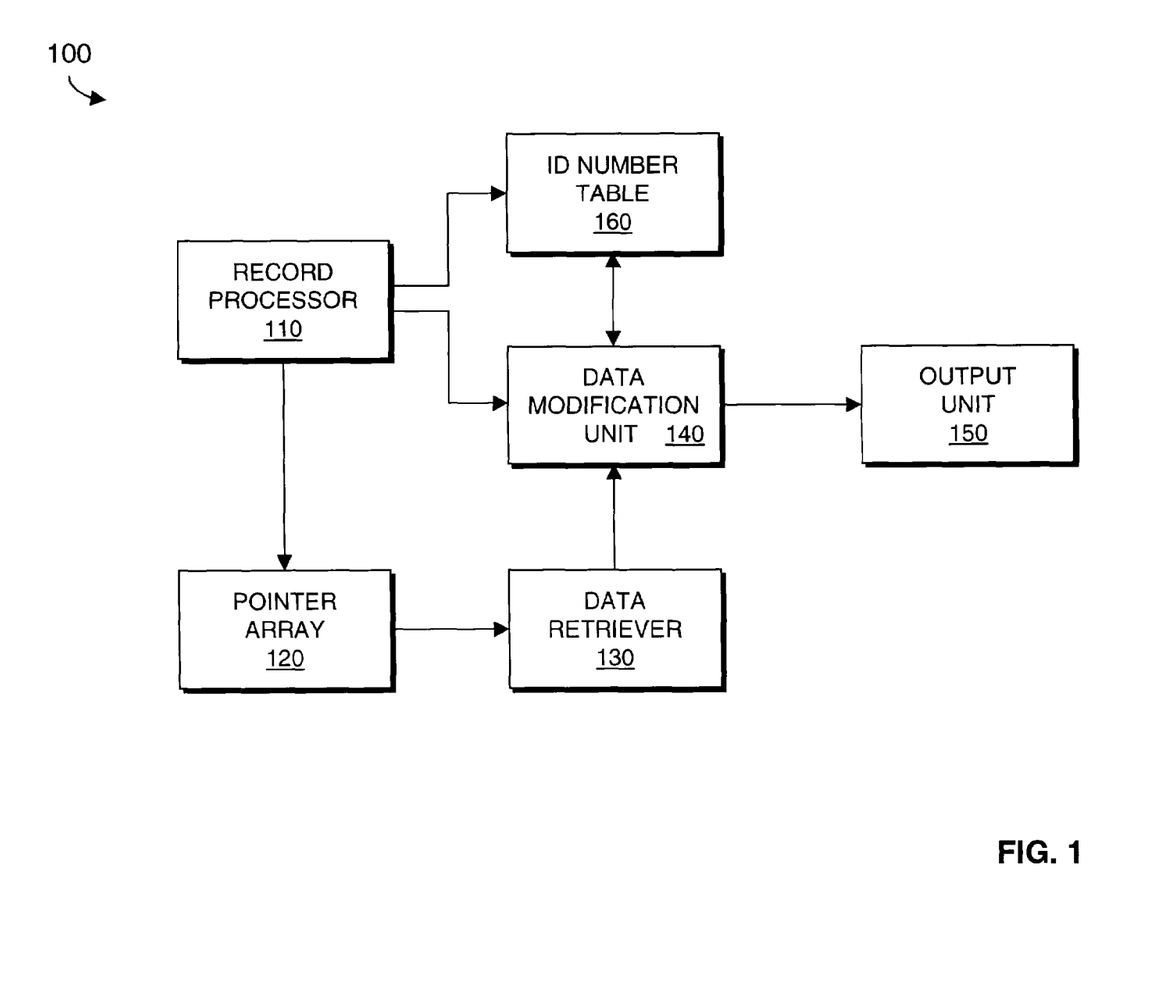
FIG. 1 is a block diagram of a pre-compression unit according to an embodiment of the present invention.

FIG. 1 is a block diagram of a compression pre-processing unit 100 according to an embodiment of the present invention. The compression pre-processing unit 100 operates to process data in order to increase the compression ratio of the data. The data may include, for example, data stored in an object-oriented database. The compression pre-processing unit 100 includes a record processor 110. The record processor 110 receives records from an object-oriented database and determines a type of the record. Records of a same type have the same number of fields. Corresponding fields of records of the same type have fields of the same type. According to an embodiment of the present invention, the record processor 110 determines a type of the record from a type identifier in the record. Alternatively, the record processor 110 may determine a type of the record from data in the record, properties of the record, information implicit in an instruction to process the record, or other information.

The compression pre-processing unit 100 includes a pointer array 120. The pointer array 120 includes a plurality of pointers. Each of the pointers corresponds to one of the record types and points to a previous instance of a record of that type received by the record processor 110. Each of the pointers is initially set to point to a zero-initialized area that is at least as large as its associated record. Upon receiving an indication as to a type of a record received by the record processor 110, the pointer array 120 identifies a previous instance of that record type. After a new record is received by the record processor 110, the pointer array 120 updates the pointer for that record type to point to the record received. According to an embodiment of the compression pre-processing unit 100, the pointer array 120 includes an array of pointers that are indexed by identifiers that identify a type of record a pointer is assigned to.

The compression pre-processing unit 100 includes a data retriever 130. The data retriever 130 retrieves a previous instance of a record of a particular type as identified by the pointer array 120. According to an embodiment of the compression preprocessing unit 100, the data retriever 130 retrieves a copy of the record from the memory or storage location of the object-oriented database.

The compression pre-processing unit 100 includes a data modification unit 140. The data modification unit 140 receives the record received by the record processor 110 and a previous instance of the record type from the data retriever 130. For each field of the record, the data modification unit 140 determines the arithmetic difference between the value in the field and the value in the corresponding field of the last instance of the same record type. If the value in a field is another record (i.e. the value in the field is a record embedded "by value" in an outer record), then the arithmetic difference is determined for the value in each field of the embedded record and the value in each corresponding field of the last embedded record of the corresponding outer record.

The compression pre-processing unit 100 includes an external interface 150. The output unit 150 writes out the arithmetic differences determined by the data modification unit 140 into a file. According to an embodiment of the present invention, the order in which the output unit 150 writes out the arithmetic differences to the file corresponds directly to fields and records in the object-oriented database associated with the arithmetic differences. By representing the values in fields of records in the object-oriented database as difference values, the likelihood of finding longer repeating strings in records that normally have very short or no repeating strings is increased. Thus, the compression ratio that can be achieved by compressing the record may be increased.

According to an embodiment of the compression pre-processing unit 100, the output unit 150 writes out the file onto a persistent storage device such as a CD, disk, tape, or other storage media. The file may be compressed by the output unit 150 prior to being written onto the persistent storage device by utilizing a dictionary-based compression algorithm such as, for example, gzip, zlib, or the WLZ family of dictionary-based compression algorithms. Alternatively, the data in the modified object-oriented database may be compressed after being written onto the persistent storage device. The file may be transmitted to a destination where the file may be uncompressed. The data in the file may also be converted back into the original data found in the object-oriented database by a data restoration unit (not shown) that takes an arithmetic sum of the difference values stored. According to an embodiment of the present invention, the data in the file may be converted back into the original data and written to a second file. Alternatively, the file may be converted back into the original data in memory only and never written to a second file.

It should be appreciated that the techniques of the present invention may be utilized in network file server systems that house data such as object-oriented databases and transmit data from the object-oriented databases over a network to clients located remotely. The techniques of the present invention may be used to pre-process and compress the data such that it can be transmitted utilizing the limited network bandwidth available.

The compression pre-processor 100 includes an ID number table 160. The ID number table 160 operates to map relationships between memory addresses of records and ID numbers assigned to records. According to an embodiment of the present invention, ID numbers are assigned sequentially to pointers as required. The ID numbers may be assigned by the record processor 110 or the data modification unit 140 depending on whether the object or the pointer of the object is encountered first. When fields of a record include pointers, a special ID is written to the file instead of the first instance of any ID that is encountered. The special ID is selected such that it can be distinguished from the difference between any two legal ID numbers. For example, a special ID may be selected such that it is the maximum value that can be stored. A second special ID may be used to identify the NULL pointer (i.e., a pointer that points to a fictitious record such as the zero-initialized area).

According to an embodiment of the present invention, the blocks shown in FIG. 1 represents software modules that process data as described. According to one embodiment, processing of data may be performed by a computer system in response to a processor executing sequences of instructions represented by blocks 110, 120, 130, 140, 150, and 160. In alternative embodiments, hard-wire circuitry may be used in place of or in combination with software instructions to implement the present invention. Thus, the present invention is not limited to any specific combination of hardware circuitry and software.

Figure 2:
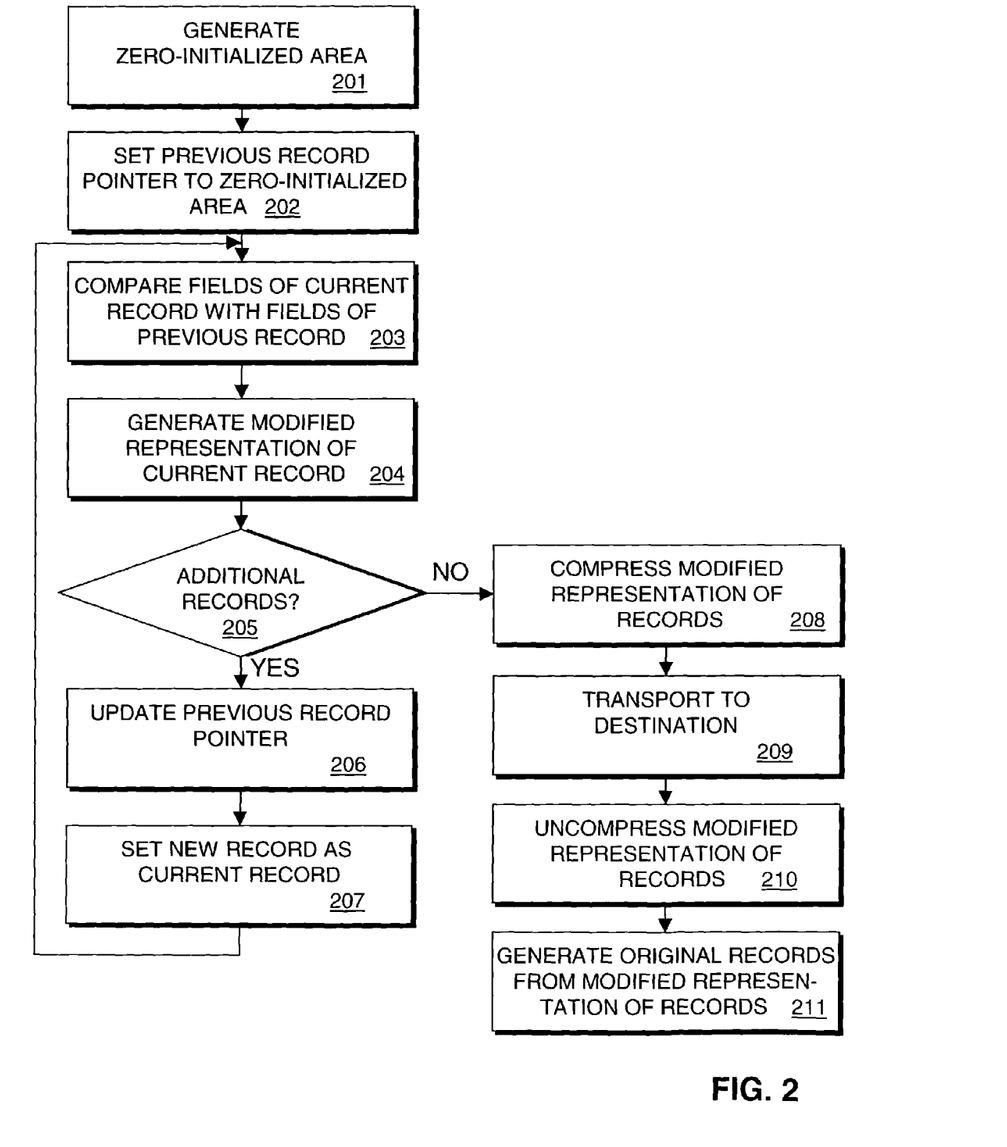
FIG. 2 is a flow chart illustrating a method for managing records according to an embodiment of the present invention.

FIG. 2 is a flow chart illustrating a method for managing records according to an embodiment of the present invention. At step 201, a zero-initialized area is generated for each record type in the object-oriented database. The zero-initialized area has a size at least as large as its associated record. According to an embodiment of the present invention, the zero-initialized area may be a single area used for all the record types. In this embodiment, the zero-initialized area is as large as the largest record type.

At step 202, previous record pointers associated with each record type is set to point to its associated zero-initialized area. By pointing to a zero-initialized area, the pointer is indicating that the previous instance of a record of that type is a record that has fields having zero values.

At step 203, values in fields of a current record is compared with values in fields of a previous instance of the record. According to an embodiment of the present invention, an arithmetic difference of the values in fields of the current record and the values in fields of the previous instance of the record, as identified by the pointer, is determined.

At step 204, a modified representation of the current record is generated. According to an embodiment of the present invention, this is achieved by writing the arithmetic differences into a file. The order in which the arithmetic differences are written into the file corresponds to a field and record of the object-oriented database.

At step 205, it is determined whether additional records are to be processed. If additional records are to be process, control proceeds to step 206. If additional records are not to be processed, control proceeds to step 207.

At step 206, the previous record pointer corresponding to the current record's type is updated to point to the current record.

At step 207, a next record received is set to be the current record. Control proceeds to step 203.

At step 208, the modified representation of the current record is compressed. According to an embodiment of the present invention, this is achieved by running a dictionary-based compression algorithm on the file.

At step 209, the modified representation of the records is transported to a destination. According to an embodiment of the present invention, the file including the modified representation of the records may be stored on a persistent storage medium and sent to the destination. Alternatively, the file including the modified representation of the records may be transmitted to the destination over the Internet, or other transmission media.

At step 210, the compressed modified representation of the records are uncompressed. According to an embodiment of the present invention, the records may be uncompressed utilizing the converse of the steps described in steps 201-207.

At step 211, the modified representation of the records are converted back into the original records of the object-oriented database.

Figure 3:
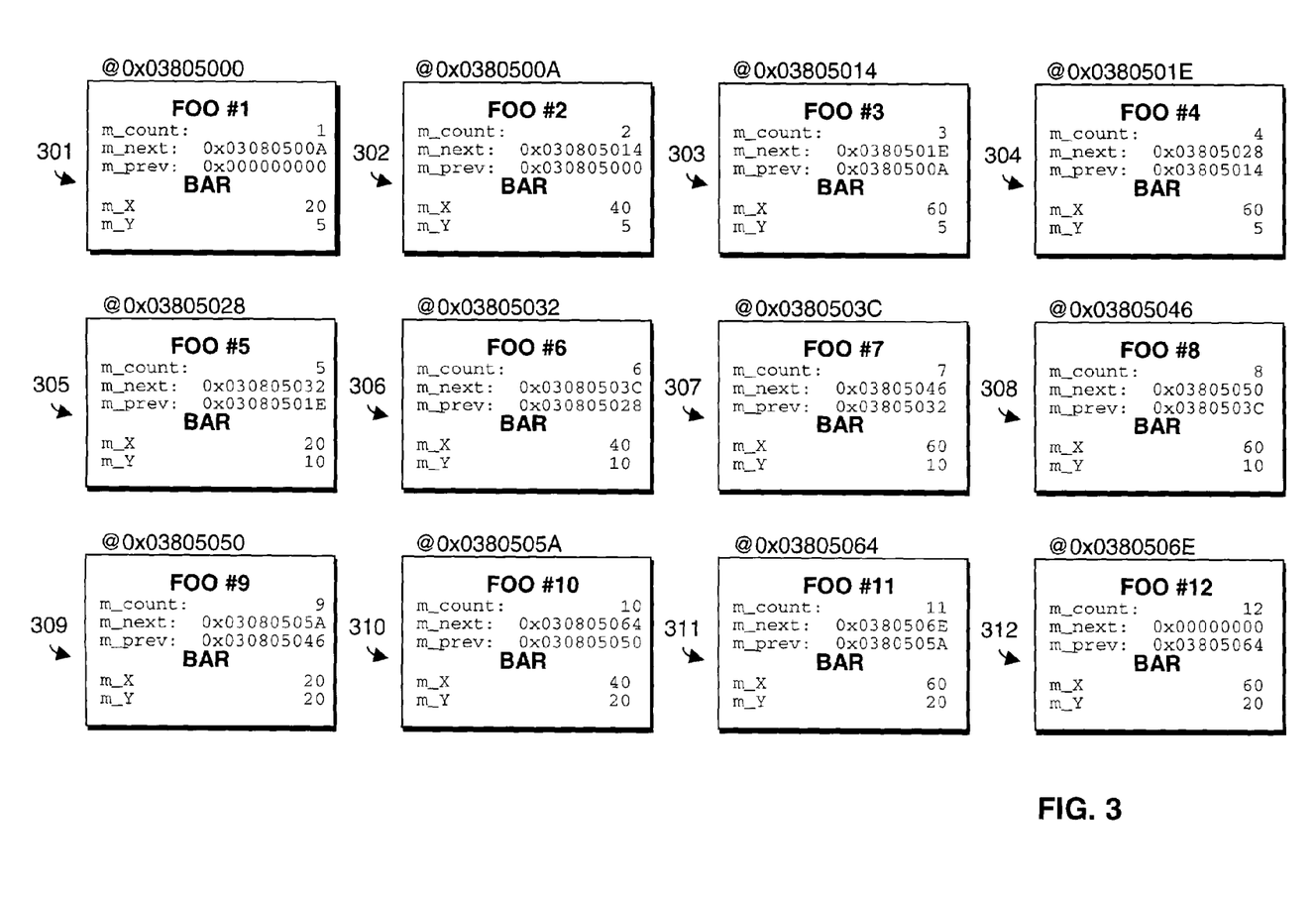
FIG. 3 illustrates exemplary records to be processed according to an embodiment of the present invention.

FIG. 3 illustrates exemplary records 301-312 to be processed according to an embodiment of the present invention. Each of the records 301-312 has a record name associated with it. Records 301-312 have the names Foo#1-#12, respectively. In this example, records 301-312 are records of a first type and are serialized in the order numbered. The memory address for each of the records 301-312 is shown above its name.

Each of the records 301-312 has a plurality of fields. A first field in each of the records 301-312 stores a value that relates to a count. The count may be, for example, a count of the number of Foo type objects in an object-oriented database. A second field in each of the records 301-312 stores a value that points to a memory address of a next instance of the record. Since no record of like type follows record 312, the second field for record 312 stores a memory address of 0x00000000. A third field in each of the records 301-312 stores a value that points to a memory address of a previous instance of the record. Since no record of like type precedes record 301, the third field for record 301 stores the memory address of 0x00000000. Within each of the records 301-312 is a second record with the name "Bar". Each of the bar objects 321-332 includes a first field that stores an X value and a second field that stores a Y value.

Figure 4:
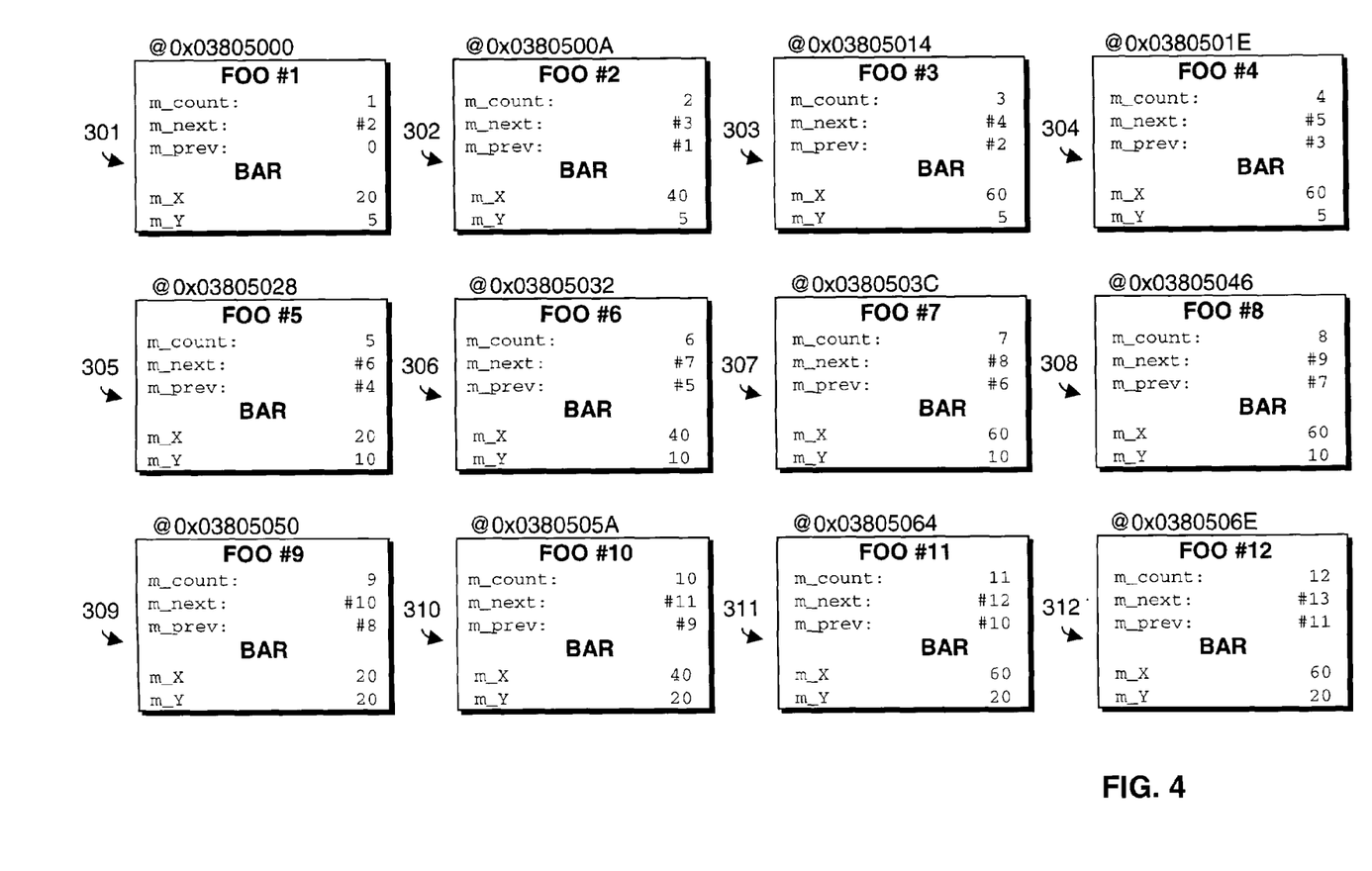
FIG. 4 illustrates the exemplary records shown in FIG. 3 with pointer values converted to record IDs.

FIG. 4 illustrates the exemplary records shown in FIG. 3 with pointer values converted to ID numbers. Instead of having the second and third fields of the records 301-312 point to memory addresses, the second and third fields of the records 301-312 are shown to include pointers that point to ID numbers. Each of the ID numbers corresponds to one of the records 301-312. The ID number of a record is substituted for the memory address of the record. In the case where a memory address does not correspond to a record, the ID number 0 is assigned. Typically, the ID numbers assigned to a record are written only to the file and not to the object-oriented database stored in memory. Thus, FIG. 4 presents only a virtual representation of the records 301-312.

Figure 5:
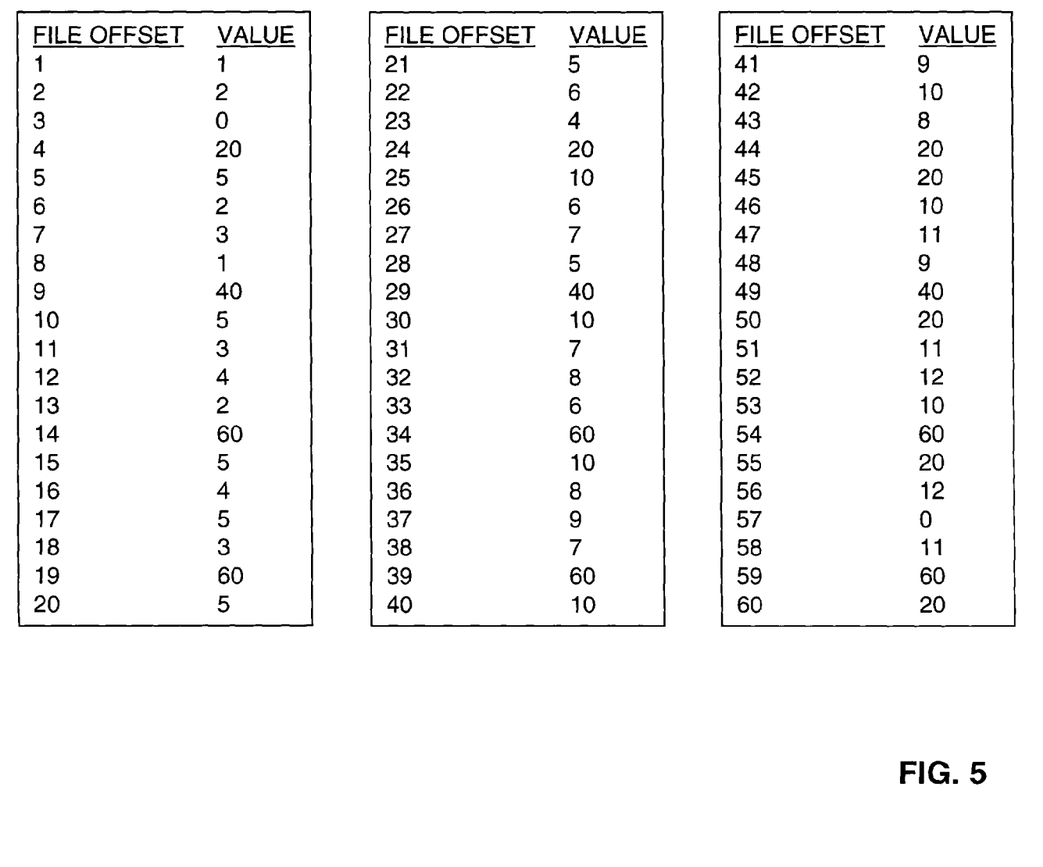
FIG. 5 is a table that illustrates the file data of the records shown in FIG. 4.

FIG. 5 is a table that illustrates the file data of the exemplary records shown in FIG. 4. The table includes a column of values and their offset in the file. The values written represent the values that would be written to a file if the exemplary records shown in FIG. 4 were written to the file. The values at file offset 1-5, 6-10, 11-15, 16-20, 21-25, 26-30, 31-35, 36-40, 41-45, 46-50, 51-55, and 56-60 correspond to records 301-312, respectively. It should be noted that only a few repeating strings exist among the values.

Figure 6:
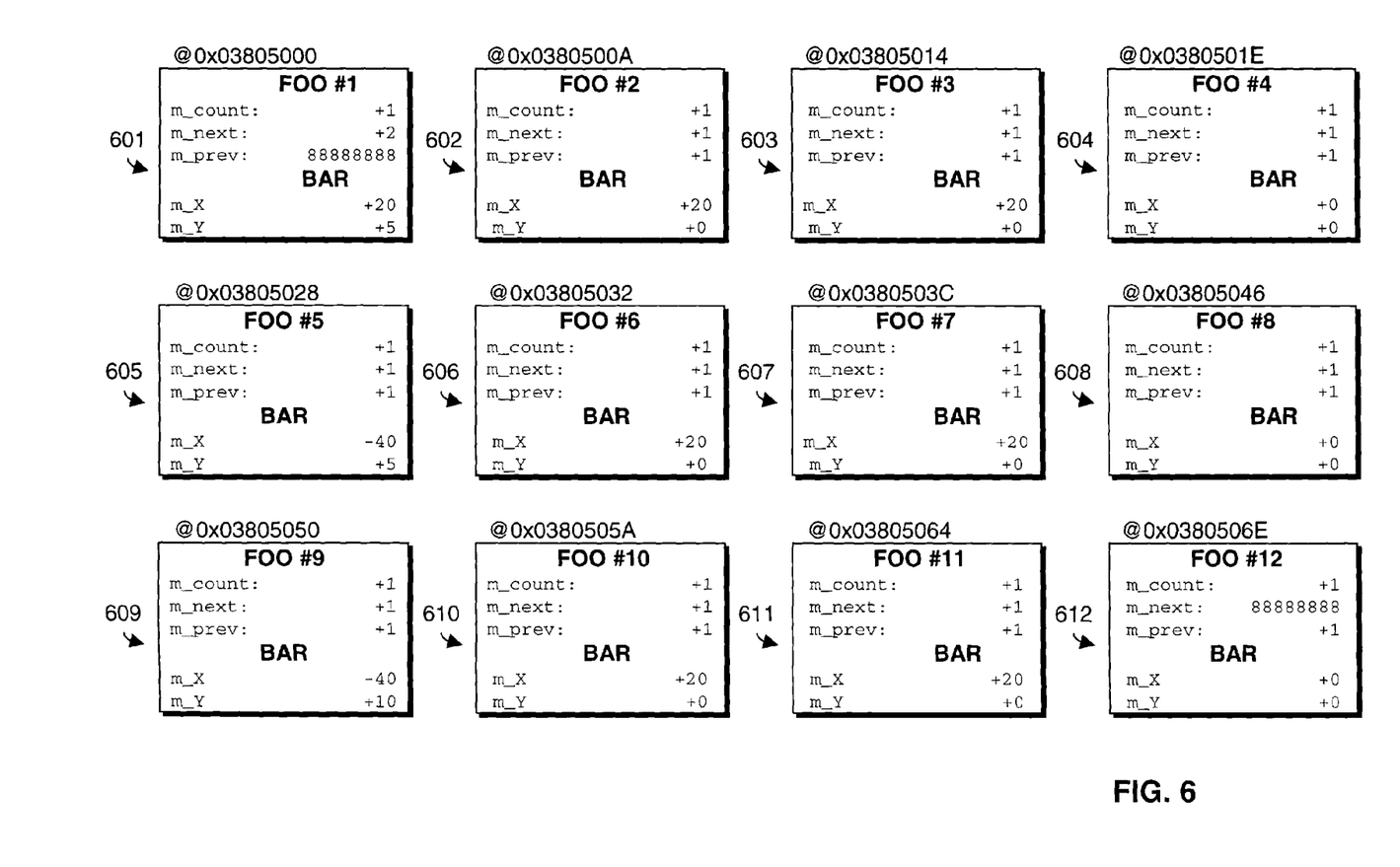
FIG. 6 illustrates modified representations of the records shown in FIG. 4.

FIG. 6 illustrates modified representations of the records shown in FIG. 5 as generated by the compression pre-processor 100 (shown in FIG. 1). The process of generating the modified representations is illustrated with the aid of FIG. 2. In this example, records of type Foo are received by the compression pre-processor 100 in the order as designated by the ID number assigned. At step 201, a zero-initialized area is generated for the records of type Foo.

At step 202, a pointer is set to the zero-initialized area.

At step 203, the arithmetic difference is taken of the values in the fields of the current record, record 301, and the values in the field of a previous instance of the record as indicated by the pointer, the zero-initialized area. Values 0, 0, 0, 0, and 0 are subtracted from the values 1, 2, 0, 20, and 5 respectively.

At step 204, the difference values +1, +2, +0, +20, and +5 would normally be written into a file. However, since value 0 from the third field of record 301 represents a pointer to a fictitious record, this value is assigned a special ID, 88888888. This is shown in record 601.

At step 205, it is determined that additional records exist.

At step 206, the pointer is updated to point to record 301.

At step 207, record 302 is set as the current record.

At step 203, the arithmetic difference is taken of the values in the fields of the current record, record 302, and the values in the field of a previous instance of the record as indicated by the pointer, record 301. Values 1, 2, 0, 20, and 5 are subtracted from the values 2, 3, 1, 40, and 5 respectively.

At step 204, the difference values +1, +1, +1, +20, and +0 are written into the file. This is shown in record 602.

At step 205, it is determined that additional records exist.

At step 206, the pointer is updated to point to record 302.

At step 207, record 303 is set as the current record.

At step 203, the arithmetic difference is taken of the values in the fields of the current record, record 303, and the values in the field of a previous instance of the record as indicated by the pointer, record 302. Values 2, 3, 1, 40, and 5 are subtracted from the values 3, 4, 2, 60, and 5 respectively.

At step 204, the difference values +1, +1, +1, +20, and +0 are written into the file. This is shown in record 603.

At step 205, it is determined that additional records exist.

At step 206, the pointer is updated to point to record 303.

At step 207, record 304 is set as the current record.

At step 203, the arithmetic difference is taken of the values in the fields of the current record, record 304, and the values in the field of a previous instance of the record as indicated by the pointer, record 303. Values 3, 4, 2, 60, and 5 are subtracted from the values 4, 5, 3, 60, and 5 respectively.

At step 204, the difference values +1, +1, +1, +0, and +0 are written into the file. This is shown I record 604.

At step 205, it is determined that additional records exist.

At step 206, the pointer is updated to point to record 304.

At step 207, record 305 is set as the current record.

At step 203, the arithmetic difference is taken of the values in the fields of the current record, record 305, and the values in the field of a previous instance of the record as indicated by the pointer, record 304. Values 4, 5, 3, 60, and 5 are subtracted from the values 5, 6, 4, 20, and 10 respectively.

At step 204, the difference values +1, +1, +1, −40, and +5 are written into the file. This is shown in record 605.

At step 205, it is determined that additional records exist.

At step 206, the pointer is updated to point to record 305.

At step 207, record 306 is set as the current record.

At step 203, the arithmetic difference is taken of the values in the fields of the current record, record 306, and the values in the field of a previous instance of the record as indicated by the pointer, record 305. Values 5, 6, 4, 20, and 10 are subtracted from the values 6, 7, 5, 40, and 10 respectively.

At step 204, the difference values +1, +1, +1, +20, and +0 are written into the file. This is shown in record 606.

At step 205, it is determined that additional records exist.

At step 206, the pointer is updated to point to record 306.

At step 207, record 307 is set as the current record.

At step 203, the arithmetic difference is taken of the values in the fields of the current record, record 307, and the values in the field of a previous instance of the record as indicated by the pointer, record 306. Values 6, 7, 5, 40, and 10 are subtracted from the values 7, 8, 6, 60, and 10 respectively.

At step 204, the difference values +1, +1, +1, +20, and +0 are written into the file. This is shown in record 607.

At step 205, it is determined that additional records exist.

At step 206, the pointer is updated to point to record 307.

At step 207, record 308 is set as the current record.

At step 203, the arithmetic difference is taken of the values in the fields of the current record, record 308, and the values in the field of a previous instance of the record as indicated by the pointer, record 307. Values 7, 8, 6, 60, and 10 are subtracted from the values 8, 9, 7, 60, and 10 respectively.

At step 204, the difference values +1, +1, +1, +0, and +0 are written into the file. This is shown in record 608.

At step 205, it is determined that additional records exist.

At step 206, the pointer is updated to point to record 308.

At step 207, record 309 is set as the current record.

At step 203, the arithmetic difference is taken of the values in the fields of the current record, record 309, and the values in the field of a previous instance of the record as indicated by the pointer, record 308. Values 8, 9, 7, 60, and 10 are subtracted from the values 9, 10, 8, 20, and 20 respectively.

At step 204, the difference values +1, +1, +1, −40, and +10 are written into the file. This is shown in record 609.

At step 205, it is determined that additional records exist.

At step 206, the pointer is updated to point to record 309.

At step 207, record 310 is set as the current record.

At step 203, the arithmetic difference is taken of the values in the fields of the current record, record 310, and the values in the field of a previous instance of the record as indicated by the pointer, record 309. Values 9, 10, 8, 20, and 20 are subtracted from the values 10, 11, 9, 40, and 20 respectively.

At step 204, the difference values +1, +1, +1, +20, and +0 are written into the file. This is shown in record 610.

At step 205, it is determined that additional records exist.

At step 206, the pointer is updated to point to record 310.

At step 207, record 311 is set as the current record.

At step 203, the arithmetic difference is taken of the values in the fields of the current record, record 311, and the values in the field of a previous instance of the record as indicated by the pointer, record 310. Values 10, 11, 9, 40, and 20 are subtracted from the values 11, 12, 10, 60, and 20 respectively.

At step 204, the difference values +1, +1, +1, +20, and +0 are written into the file. This is shown in record 611.

At step 205, it is determined that additional records exist.

At step 206, the pointer is updated to point to record 311.

At step 207, record 312 is set as the current record.

At step 203, the arithmetic difference is taken of the values in the fields of the current record, record 312, and the values in the field of a previous instance of the record as indicated by the pointer, record 311. Values 11, 12, 10, 60, and 20 are subtracted from the values 12, 0, 11, 60, and 20 respectively.

At step 204, the difference values +1, −12, +1, +0, and +0 would normally be written into the file. However, since the value 0 in the second field of record 312 represents a pointer to a fictitious record, this value is assigned a special ID, 88888888. This is shown as record 612.

At step 205, it is determined that no additional records exist.

It should be appreciated that steps 208-211 may be performed on the modified representation of the records written to file.

Figure 7:
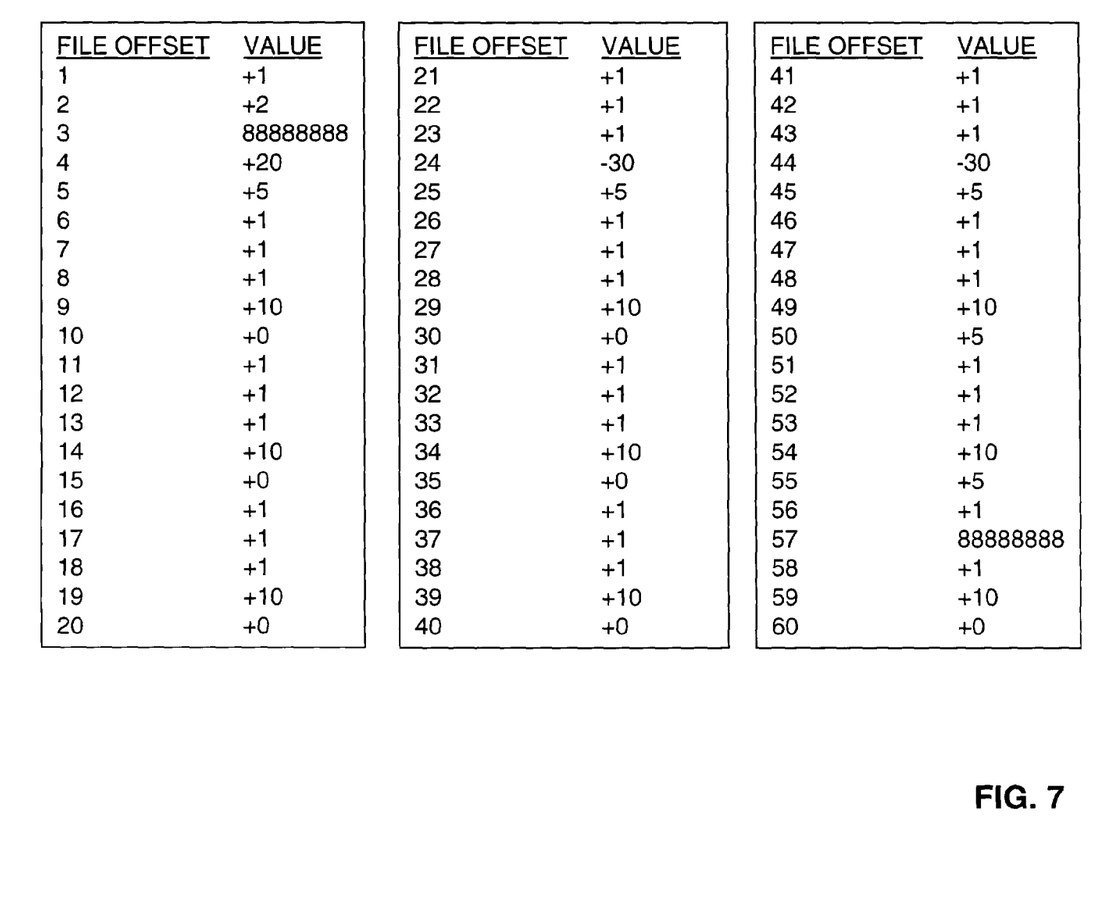
FIG. 7 is a table illustrating the file data of the modified representations shown in FIG. 6.

FIG. 7 is a table illustrating the file data after representation of the data has been modified. The table includes a column of values and their offset in the file. The values written represent the values of the modified representation of the records. The values at file offset 1-5, 6-10, 11-15, 16-20, 21-25, 26-30, 31-35, 36-40, 41-45, 46-50, 51-55, and 56-60 correspond to records 601-612, respectively. It should be noted that the number of repeating strings shown in FIG. 7 is noticeably greater than the number of repeating string shown in FIG. 5.

The benefits of generating modified representations of data in an object-oriented database for compression purposes can be realized when patterns in the data include incrementation of values that are persistent throughout the database. When patterns in data, however, include regularity and repetition such as those found, for example, in describing the routing graph of a PLD, a compact representation of the data may be made for the purposes of supporting efficient transport of the object-oriented database. In this example, a routing graph for a PLD describes the wiring and connectivity of the PLD. The routing graph may be written in a human readable, text format. This representation of the routing graph may include strings that describe the identity and location of routing elements in the PLD.

An example of a string is GH123R1. This string includes a routing element type "GH" which designates the routing element type as a global horizontal line. The string includes an index "123" which identifies a particular global horizontal line. The string includes a location type "R" which describes the location type as a row. The string also includes location type index "1" which describes the location of the routing element as being in row 1. Similarly, string P0R1C0 may be used to describe a routing element type "P" which is a pin having an index 0 at row 1 and column 0 of the PLD.

A plurality of strings grouped together may be used to describe the relationship between a plurality of routing elements in the PLD. For example, the following string may be used to describe a global horizontal line, having index 123 at row 1 fanning out to a first pin, having index 0 at row 1 column 0, a second pin, having index 2 at row 1 column 1, and a third pin, having index 5 at row 1 column 2.

GH123R1=>P0R1C0 P2R1C1 P5R1C2

The following string may be used to describe a global horizontal line, having index 123 at row 1 being fed by a first pin, having index 0 at row 1 column 0, a second pin, having index 2 at row 1 column 1, and a third pin, having index 5 at row 1 column 2.

GH123R1<=P0R1C0P2R1C1 P5R1C2

Because most PLDs are created by tiling repeated or isomorphic structures, the routing architecture of a PLD also includes many repeated structures. The repeated structures in a PLD may be described using looping structures that present the relationships between routing elements in a PLD using a more compact representation. According to one embodiment of the present invention, ranges and meta-characters are used in place of specific numbers to represent a variable in an implied for-loop.

As an example, the following relationships are given.

GH000R0=>P1R0C1 P2R0C1
GH000R1=>P1R1C1 P2R1C1
GH000R2=>P1R2C1 P2R2C1

From the relationships shown, routing element GH index 0 in rows 0 through 2 feeds routing element P with indices 1 and 2 in the same rows in the first column. Utilizing looping structures, the expressions shown above in "flat format" may be presented in a compact representation such as the one shown below.

GH000R[0 . . . 2]=>P[1 . . . 2]R*C1

The compact representation shown above may be translated into the following programming construct.

```
for r=0 to 2 step 1 do
   for i=1 to 2 step 1 do
      connect GH INDEX 000, ROW r to P INDEX i, ROW
         r, COLUMN 1
   end-for
end-for
```

According to an embodiment of the present invention, the meta-character "*" may be used multiple times in the same element string to correspond to a variable it represents by the context it is used. An example of this is shown in the below compact representation.

GV05R[0 . . . 2]C[0 . . . 10]=>P[1.2]R*C*

In the compact representation shown above, the first meta-character "*" is associated with R and takes on the values of the range [0 . . . 2]. The second meta-character "*" is associated with C and takes on the values of the range [0 . . . 10].

The compact representation shown above may be translated into the following programming construct.

```
for r=0 to 2 step 1 do
   for c=0 to 10 step 1 do
      for i=1 to 2 step 1 do
         connect GV INDEX 05, ROW r, COLUMN c to P
            INDEX i, ROW r, COLUMN 1
      end-for
   end-for
end-for
```

It should be appreciated that the looping structure used to describe the routing architecture of a PLD may be represented utilizing either a compact representation or programming construct. In some instances, one representation may be more efficient than the other. In the previous examples, the compact representations more efficiently describe the exemplary routing architecture. However, in the example shown below, the programming construct more efficiently describes the routing architecture of the PLD.

```
rows =10
for i=0 to 99 step 1 do
   if i mod 3=0 then do
      for r=0 to rows −1 step 1 do
         connect GH INDEX i, ROW r to P INDEX i mod
            10, ROW r, COLUMN 1
      end-for
   else
      for r=0 to rows −1 step 1 do
         connect GH INDEX i, ROW r to P INDEX i mod
            10, ROW r+1, COLUMN 1
      end-for
   end-else
end-for
```

The above programming construct describes a routing architecture where every third global horizontal line connects to a pin in the row below the current row. The variable "rows" is used to contain the total number of rows in the device. The programming construct allows representation of the routing architecture to be achieved utilizing programming constructs such as if-else statements. Alternatively, without the if-else statement, the compact representation would represent the routing architecture in a less efficient manner as shown below.

GH[0]R[0 . . . 10] P[0]R[*+1]
GH[1 . . . 2]R[0 . . . 10]=>P[*mod 10]R*
GH[3]R[0 . . . 10]=>P[3]R[*+1]
GH[4 . . . 5]R[0 . . . 10]=>P[*mod 10]R*

Although the examples illustrated above show specific ranges and meta-characters representing parameters of similar types and corresponding in a 1-to-1 relationship, it should be appreciated that the looping structures may be utilized to represent more complicated patterns and relationships between routing elements in a PLD. The looping structures may, for example, utilize any known programming construct, conditional statements, or arithmetic representation to describe the relationships between routing elements in the PLD.

Instead of transporting data describing the routing graph in the flat-format or in binary files that contain an object-oriented database that includes the data describing the routing graph, the data may be transported in the text format described. Utilizing looping structures to represent the routing graphs decreases the amount of storage space and bandwidth required for transporting the data. Utilizing a dictionary-based compression algorithm on the looping structures may further reduce the storage space and bandwidth required for transporting the data. Once the data describing the routing graph is transported to its destination, an object-oriented database may be generated utilizing the data. The techniques described in FIG. 2 may optionally be utilized to reduce the size of the database at the destination.

Although the example of the human readable, text format used for representing routing graphs is described using specific designations and conventions for describing specific routing elements, their location on the PLD, and their relationships with other routing elements, the present invention may be utilized with other formats used for representing routing graphs. The looping structures described may be used to present a compact representation of data other than routing graphs of PLD that may be have repetitive structures. It should be appreciated that the looping structures described may be utilized to present a compact representation of any data that describes repetitive structures or repeated patterns.

Figure 8:
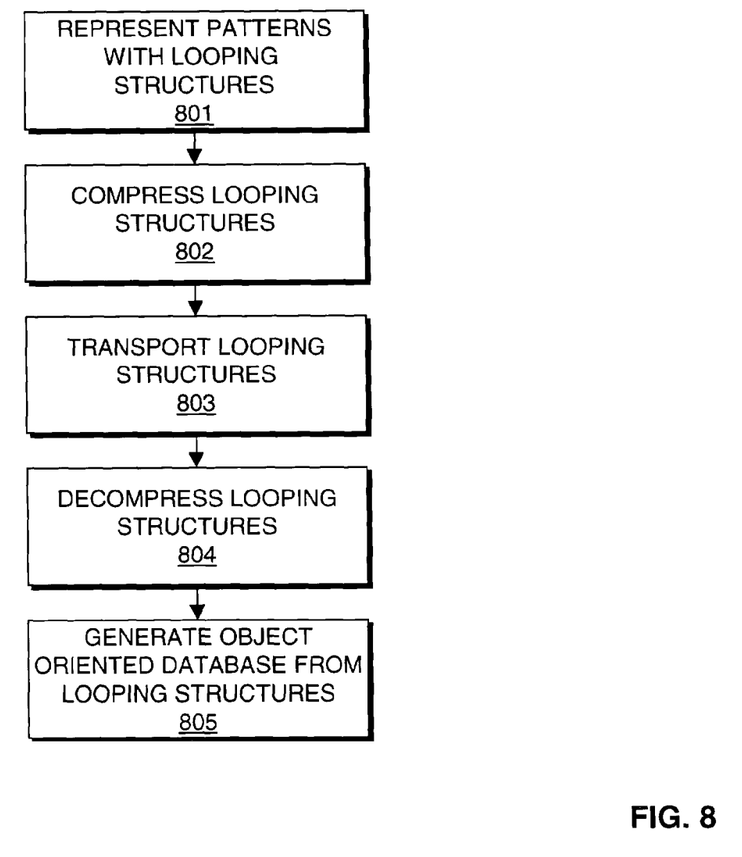
FIG. 8 is a flow chart illustrating a method for managing data associated with a programmable logic device (PLD) according to an embodiment of the present invention.

FIG. 8 is a flow chart illustrating a method for managing data associated with a programmable logic device (PLD) according to an embodiment of the present invention. At step 901, patterns are represented with looping structures. According to an embodiment of the present invention, looping structures with ranges and meta-characters are utilized to provide a compact representation of relationships between routing elements in the PLD having repeated patterns.

At step 802, the looping structures are compressed. According to one embodiment, this may be achieved by utilizing a dictionary-based compression algorithm.

At step 803, the looping structures are transported to a destination. This may be achieved by writing the looping structures onto a persistent storage device such as a CD, disk, tape, or other media and sending the persistent storage device to the destination. Alternatively, the looping structures may be transmitted electronically to the destination using a transmission medium such as the Internet.

At step 804, the looping structures are decompressed.

At step 805, an object-oriented database is generated from the looping structures at the destination. According to an embodiment of the present invention, the object-oriented database may be further compressed utilizing the technique described in FIG. 2.

FIGS. 2 and 8 are flow charts illustrating a methods for managing records and a method for managing data associated with a PLD. Some of the steps illustrated in these figures may be performed sequentially, in parallel or in an order other than that which is described. It should be appreciated that not all of the steps described are required to be performed, that additional steps may be added, and that some of the illustrated steps may be substituted with other steps.

Embodiments of the present invention (e.g. exemplary process described below with respect to FIGS. 2 and 8) may be provided as a computer program product, or software, that may include a machine-readable medium having stored thereon instructions. The machine-readable medium may be used to program a computer system or other electronic device. The machine readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for managing data associated with a programmable logic device (PLD), comprising:
    representing routing architecture patterns for the PLD with looping structures;
    compressing the looping structures;
    transmitting the looping structures to a secondary location;
    generating a database from the looping structures at the secondary location;
    identifying patterns in data in corresponding fields of records in the database;
    generating modified representations of the data in response to the patterns in the data; and
    compressing the modified representations of the data utilizing similarities in the modified representations of the data.

2. The method of claim 1, wherein the routing architecture patterns comprises similarities in types of routing elements.

3. The method of claim 1, wherein the routing architecture patterns comprises similarities in locations of routing elements.

4. The method of claim 1, wherein representing the routing architecture patterns in the PLD with looping structures comprises:
    assigning a range of values to a parameter associated with a first routing element; and
    assigning a meta-character to a parameter associated with a second routing element to represent a plurality of relationships between similar routing elements in the PLD.

5. The method of claim 4, wherein the parameter associated with the first routing element comprises an index or location.

6. The method of claim 1, wherein the looping structures are in text format.

7. The method of claim 1, wherein generating the modified representations of the data comprises determining an arithmetic difference between data in a field of a record and data in a corresponding field from a previous instance of the record.

8. The method of claim 1, further comprising programming a second programmable logic device with the routing architecture patterns described by the looping structures at the second location.

9. A non-transitory machine-readable storage medium having stored thereon sequences of instructions, the sequences of instructions including instructions which, when executed by a processor, causes the processor to perform:
    representing routing architecture patterns for a programmable logic device (PLD) with looping structures;
    compressing the looping structures;
    transmitting the looping structures to a secondary location;
    generating a database from the looping structures at the secondary location;
    identifying patterns in data in corresponding fields of records in the database;
    generating modified representations of the data in response to the patterns in the data; and
    compressing the modified representations of the data utilizing similarities in the modified representations of the data.

10. The machine-readable storage medium of claim 9, wherein the routing architecture patterns comprises similarities in types of routing elements.

11. The machine-readable storage medium of claim 9, wherein the routing architecture patterns comprises similarities in locations of routing elements.

12. The machine-readable storage medium of claim 9, wherein representing the routing architecture patterns in the PLD with looping structures comprises:
    assigning a range of values to a parameter associated with a first routing element; and
    assigning a meta-character to a parameter associated with a second routing element to represent a plurality of relationships between similar routing elements in the PLD.

13. The machine-readable storage medium of claim 12, wherein the parameter associated with the first routing element comprises an index or location.

14. The machine-readable storage medium of claim 9, wherein the looping structures are in text format.

15. The machine-readable storage medium of claim 9, wherein generating the modified representations of the data comprises determining an arithmetic difference between data in a field of a record and data in a corresponding field from a previous instance of the record.

16. The machine-readable storage medium of claim 9, further comprising instructions which when executed by the processor causes the processor to perform programming a second programmable logic device with the routing architecture patterns described by the looping structures at the second location.

* * * * *